(12) United States Patent
Hoentschel et al.

(10) Patent No.: US 7,399,663 B2
(45) Date of Patent: Jul. 15, 2008

(54) EMBEDDED STRAIN LAYER IN THIN SOI TRANSISTORS AND A METHOD OF FORMING THE SAME

(75) Inventors: Jan Hoentschel, Neustadt in Sachsen (DE); Andy Wei, Dresden (DE); Manfred Horstmann, Duerrrohrsdorf-Dittersbach (DE); Thorsten Kammler, Ottendorf-Okrilla (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 11/466,572

(22) Filed: Aug. 23, 2006

(65) Prior Publication Data

US 2007/0096148 A1     May 3, 2007

(30) Foreign Application Priority Data

Oct. 31, 2005 (DE) ............... 10 2005 052 055

(51) Int. Cl.
H01L 21/00 (2006.01)
H01L 21/336 (2006.01)

(52) U.S. Cl. ............ 438/151; 438/149; 438/150; 438/300; 257/E21.626; 257/E21.428

(58) Field of Classification Search ......... 438/149, 438/150, 151, 300; 257/E21.419, E21.428, 257/E21.626
See application file for complete search history.

(56) References Cited

U.S. PATENT DOCUMENTS

| | | | | |
|---|---|---|---|---|
| 6,642,133 B2 * | 11/2003 | Roberds et al. | ......... | 438/595 |
| 7,078,742 B2 * | 7/2006 | Lin et al. | ......... | 257/190 |
| 7,144,785 B2 * | 12/2006 | Dakshina-Murthy et al. | ......... | 438/297 |
| 7,227,205 B2 * | 6/2007 | Bryant et al. | ......... | 257/288 |
| 7,238,580 B2 * | 7/2007 | Orlowski et al. | ......... | 438/300 |
| 7,335,929 B2 * | 2/2008 | Lin et al. | ......... | 257/192 |
| 2003/0057416 A1 | 3/2003 | Currie et al. | ......... | 257/19 |
| 2004/0104447 A1 | 6/2004 | Kim et al. | ......... | 257/506 |
| 2004/0108559 A1 | 6/2004 | Sugii et al. | ......... | 257/411 |
| 2004/0188760 A1 | 9/2004 | Skotnicki et al. | ......... | 257/347 |
| 2005/0035470 A1 * | 2/2005 | Ko et al. | ......... | 257/900 |
| 2005/0082531 A1 | 4/2005 | Rim | ......... | 257/72 |
| 2005/0116290 A1 | 6/2005 | De Souza et al. | ......... | 257/347 |
| 2005/0156202 A1 * | 7/2005 | Rhee et al. | ......... | 257/213 |
| 2006/0115941 A1 * | 6/2006 | Shin | ......... | 438/197 |

FOREIGN PATENT DOCUMENTS

| | | | | |
|---|---|---|---|---|
| EP | 1 734 568 A2 | 6/2006 | ......... | 21/336 |
| WO | 2004/001798 | 12/2003 | | |
| WO | 2006/052379 A1 | 5/2006 | ......... | 21/336 |

OTHER PUBLICATIONS

International Search Report Dated Feb. 9, 2007.
Malgorzata Jurczak, et al. "Silicon-on-Nothing (SON)—and Innovative Process for Advanced CMOS" IEEE Transactions on Electron Devices, vol. 47, No. 11, Nov. 2000.

* cited by examiner

*Primary Examiner*—Scott B. Geyer
*Assistant Examiner*—Seahvosh J Nikmanesh
(74) *Attorney, Agent, or Firm*—Williams, Morgan & Amerson, P.C.

(57) ABSTRACT

By forming a deep recess through the buried insulating layer and re-growing a strained semiconductor material, an enhanced strain generation mechanism may be provided in SOI-like transistors. Consequently, the strain may also be efficiently created by the embedded strained semiconductor material across the entire active layer, thereby significantly enhancing the performance of transistor devices, in which two channel regions may be defined.

18 Claims, 5 Drawing Sheets

EMBEDDED STRAIN LAYER IN THIN SOI TRANSISTORS AND A METHOD OF FORMING THE SAME

BACKGROUND OF THE INVENTION

1. Field of the Invention

Generally, the present invention relates to the formation of integrated circuits, and, more particularly, to the formation of SOI-like transistor types, such as fully and partially depleted transistors, formed in and on a thin semiconductor layer, and having strained channel regions, by using an embedded strain layer to enhance charge carrier mobility in the channel region.

2. Description of the Related Art

The fabrication of integrated circuits requires the formation of a large number of circuit elements on a given chip area according to a specified circuit layout. Generally, a plurality of process technologies are currently practiced, wherein, for complex circuitry, such as microprocessors, storage chips and the like, CMOS technology is currently the most promising approach, due to the superior characteristics in view of operating speed and/or power consumption and/or cost efficiency. During the fabrication of complex integrated circuits using CMOS technology, millions of transistors, i.e., N-channel transistors and P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with an inversely doped channel region disposed between the drain region and the source region.

The conductivity of the channel region, i.e., the drive current capability of the conductive channel, is controlled by a gate electrode formed above the channel region and separated therefrom by a thin insulating layer. The conductivity of the channel region, upon formation of a conductive channel due to the application of an appropriate control voltage to the gate electrode, depends on the dopant concentration, the mobility of the majority charge carriers, and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the overall conductivity of the channel region substantially determines the performance of the MOS transistors. Thus, the reduction of the channel length, and associated therewith the reduction of the channel resistivity, renders the channel length a dominant design criterion for accomplishing an increase in the operating speed of the integrated circuits.

The continuing shrinkage of the transistor dimensions, however, involves a plurality of issues associated therewith that have to be addressed so as to not unduly offset the advantages obtained by steadily decreasing the channel length of MOS transistors. One major problem in this respect is the development of enhanced photolithography and etch strategies so as to reliably and reproducibly create circuit elements of critical dimensions, such as the gate electrode of the transistors, for a new device generation. Moreover, highly sophisticated dopant profiles, in the vertical direction as well as in the lateral direction, are required in the drain and source regions to provide low sheet and contact resistivity in combination with a desired channel controllability. In addition, the vertical location of the PN junctions with respect to the gate insulation layer also represents a critical design criterion in view of leakage current control. Hence, reducing the channel length may also usually require reducing the depth of the drain and source regions with respect to the interface formed by the gate insulation layer and the channel region, thereby requiring sophisticated implantation techniques. According to other approaches, epitaxially grown regions are formed with a specified offset to the gate electrode, which are referred to as raised drain and source regions, to provide increased conductivity of the raised drain and source regions, while at the same time maintaining a shallow PN junction with respect to the gate insulation layer.

Since the continuous size reduction of the critical dimensions, i.e., the gate length of the transistors, necessitates the adaptation and possibly the new development of highly complex process techniques concerning the above-identified process steps, it has been proposed to also enhance the channel conductivity of the transistor elements by increasing the charge carrier mobility in the channel region for a given channel length, thereby offering the potential for achieving a performance improvement that is comparable with the advance to a future technology node while avoiding or at least postponing many of the above process adaptations associated with device scaling. One efficient mechanism for increasing the charge carrier mobility is the modification of the lattice structure in the channel region, for instance by creating tensile or compressive stress in the vicinity of the channel region to produce a corresponding strain in the channel region, which results in a modified mobility for electrons and holes, respectively. For example, creating tensile strain in the channel region increases the mobility of electrons, wherein, depending on the magnitude and direction of the tensile strain, an increase in mobility of 50% or more may be obtained, which, in turn, may directly translate into a corresponding increase in the conductivity. On the other hand, compressive strain in the channel region may increase the mobility of holes, thereby providing the potential for enhancing the performance of P-type transistors. The introduction of stress or strain engineering into integrated circuit fabrication is an extremely promising approach for further device generations, since, for example, strained silicon may be considered as a "new" type of semiconductor material, which may enable the fabrication of fast powerful semiconductor devices without requiring expensive semiconductor materials, while many of the well-established manufacturing techniques may still be used.

Consequently, it has been proposed to introduce, for instance, a silicon/germanium layer or a silicon/carbon layer in or below the channel region to create tensile or compressive stress that may result in a corresponding strain. Although the transistor performance may be considerably enhanced by the introduction of stress-creating layers in or below the channel region, significant efforts have to be made to implement the formation of corresponding stress layers into the conventional and well-approved MOS technique. For instance, additional epitaxial growth techniques have to be developed and implemented into the process flow to form the germanium- or carbon-containing stress layers at appropriate locations in or below the channel region. Hence, process complexity is significantly increased, thereby also increasing production costs and the potential for a reduction in production yield.

Thus, in other approaches, external stress created by, for instance, overlaying layers, spacer elements and the like is used in an attempt to create a desired strain within the channel region. However, the process of creating the strain in the channel region by applying a specified external stress may suffer from an inefficient translation of the external stress into strain in the channel region. Hence, although providing significant advantages over the above-discussed approach requiring additional stress layers within the channel region, the efficiency of the stress transfer mechanism may depend on the process and device specifics and may result in a reduced performance gain for one type of transistors.

In another approach, the hole mobility of PMOS transistors is enhanced by forming a strained silicon/germanium layer in the drain and source regions of the transistors, wherein the compressively strained drain and source regions create uniaxial strain in the adjacent silicon channel region. To this end, the drain and source regions of the PMOS transistors are selectively recessed, while the NMOS transistors are masked and subsequently the silicon/germanium layer is selectively formed in the PMOS transistor by epitaxial growth. However, for SOI transistors formed in very thin silicon layers having a thickness of approximately 100 nm and even less, this technique may not result in the expected performance gain as is the case in SOI devices including less scaled active silicon layers or in bulk devices, since the stress transfer is substantially restricted to the channel region located below the gate insulation layer while lower-lying active regions in the thin SOI transistor may not be effectively strained, thereby reducing the overall efficiency of the strain engineering process.

In view of the above-described situation, there exists a need for an improved technique that enables an efficient increase of performance of PMOS transistors and NMOS transistors, while substantially avoiding or at least reducing one or more of the above-identified problems.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that enables the formation of SOI transistors, such as fully or partially depleted transistors, in which an enhanced strain generating mechanism is provided to create a desired strain substantially throughout the entire active region located below a gate electrode structure. Consequently, an efficient strain generating mechanism is provided for thin SOI transistors, in which a channel may form at an interface between a gate insulation layer and the active layer and also at an interface between a buried insulation layer and the overlying semiconductor layer. Consequently, a significant performance gain may be achieved in fully and partially depleted SOI transistors.

According to one illustrative embodiment of the present invention, a transistor device comprises a substrate having formed thereon a first crystalline semiconductor layer and a buried insulating layer formed on the first crystalline semiconductor layer. Moreover, the device comprises a second crystalline semiconductor layer formed on the buried insulating layer and a gate electrode, which is formed above the second crystalline semiconductor layer. Finally, the transistor device comprises a drain and source region that comprises a strained semiconductor material that extends into the first semiconductor layer.

According to another illustrative embodiment of the present invention, a semiconductor device comprises a substrate having formed thereon a first crystalline semiconductor layer, a buried insulating layer formed on the first crystalline semiconductor layer and a second crystalline semiconductor layer formed on the buried insulating layer. The semiconductor device further comprises a first transistor having a first drain and source region that is formed in the second semiconductor layer. Finally, the semiconductor device comprises a second transistor having a second drain and source region that comprises a strained semiconductor material, wherein the second drain and source region extends from the second semiconductor layer into the first semiconductor layer.

According to yet another illustrative embodiment of the present invention, a method comprises forming a recess adjacent to a first gate electrode of a first transistor, wherein the first gate electrode is formed above a substrate comprising a first crystalline semiconductor layer, a buried insulating layer formed on the first crystalline semiconductor layer and a second crystalline semiconductor layer formed on the buried insulating layer. Moreover, the recess extends into the first crystalline semiconductor layer. Furthermore, the method comprises epitaxially growing a strained semiconductor material in the recess.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present invention is directed to a technique that contemplates the generation of strain in channel regions of SOI-like transistors by providing a strained semiconductor material in the vicinity of the channel regions. For this purpose, the strained semiconductor material is formed in such a way that it may also efficiently provide a required strain in the vicinity of an interface between the active semiconductor layer and the buried insulating layer, thereby providing the potential for efficiently using this interface as an additional channel for charge carrier transportation in sophisticated fully and partially depleted SOI transistors. As previously explained, in sophisticated applications, SOI-type transistors may receive a very thin active semiconductor layer, such as a silicon-based layer, having a thickness of 100 nm and even significantly less so that not only the region immediately below the corresponding gate insulation layer may be used as a channel but also the interface between the active layer and the buried insulating layer may be used for charge carrier transport. However, conventional strain-inducing mechanisms by means of a strained semiconductor material may not allow an efficient generation of strain in the vicinity of the buried insulating layer, since during the epitaxial growth of the embedded strained semiconductor material, a significant portion of the original semiconductor material has to be maintained to provide a respective growth template for the subsequent growth process.

According to the present invention, the crystalline material below the buried insulating layer may be efficiently used as a template for the epitaxial growth process, thereby enabling the growth of a strained semiconductor material also in the vicinity of the interface between the buried insulating layer and the active semiconductor layer formed thereon. In addition to the provision of an enhanced strain-inducing mechanism, an increased flexibility in adjusting the transistor characteristics may also be provided, since the crystalline characteristics of the epitaxially grown strained semiconductor material may be decoupled to a high degreed from the crystalline characteristics of the active semiconductor layer formed on the buried insulating layer. Consequently, the crystalline characteristics, such as crystalline orientation, material composition and the like, of the semiconductor material acting as a growth template may be selected with respect to enhancing the characteristics of the epitaxially grown strained semiconductor material, while the initial characteristics of the active semiconductor layer formed on the buried insulating layer may be selected in accordance with other process and device requirements, such as increased mobility of charge carriers for other transistors, which may not receive the strained semiconductor material.

It should be appreciated that, in principle, the present invention may be applied to any SOI-like transistors in which strain is generated by embedded strained semiconductor material, even if the active semiconductor layer may not be appropriate for the formation of thin SOI-like transistors, in which a second channel region is formed in the vicinity of the buried insulating layer. In this case, nevertheless, a highly efficient strain mechanism may be provided wherein additionally crystalline characteristics of the strained semiconductor material may be adapted, for instance in terms of crystalline orientation, to obtain an overall enhanced performance compared to conventional approaches with embedded strain layers not extending through the buried insulating layer and into a crystalline substrate material. Consequently, unless otherwise explicitly stated in the description and in the appended claims, the present invention should not be considered to be restricted to a specific SOI architecture.

Figure 1A:
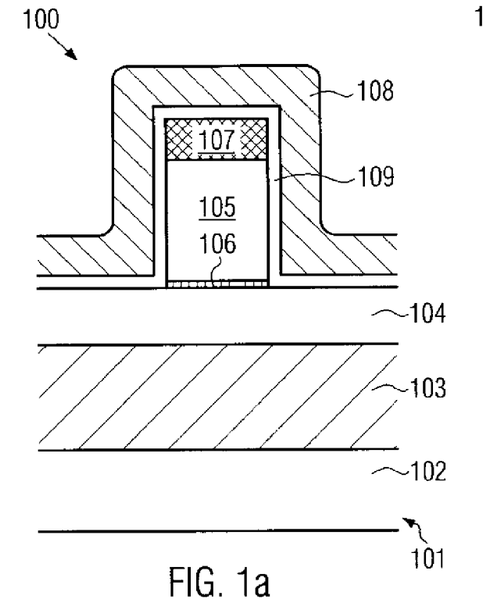
FIGS. 1a-1g schematically show cross-sectional views of a transistor element during various manufacturing stages, in which a strained semiconductor material is formed through a buried insulating layer in order to create strain continuously along substantially the entire depth in the channel region of the transistor element in accordance with illustrative embodiments of the present invention.

With reference to FIGS. 1a-1g and 2a-2f, further illustrative embodiments of the present invention will now be described in more detail. FIG. 1a schematically shows a transistor device 100 comprising a substrate 101, which may represent any appropriate substrate or a carrier material for forming thereabove SOI-like transistors. For example, the substrate 101 may represent a bulk semiconductor substrate having formed thereon a crystalline semiconductor layer 102 or a silicon-based bulk substrate having formed thereon the semiconductor layer 102 followed by a buried insulating layer 103 and a second crystalline semiconductor layer 104, which may also be referred to as an "active" layer. It should be appreciated that the substrate 101, in combination with the layers 102, 103 and 104, may represent an SOI-like architecture, wherein the active layer 104 may not necessarily be comprised of silicon and, hence, the term SOI-like transistor or architecture needs to be understood as a generic term without restricting the layer 104 to a silicon material. However, in some illustrative embodiments, the first semiconductor layer 102 may be comprised of silicon and the second semiconductor layer 104 may also represent a silicon-based material, such as a doped silicon material, a silicon/germanium material and the like. In other embodiments, the semiconductor layers 102 and 104 may differ in at least one characteristic, such as crystal orientation, material composition and the like. For example, in one embodiment, the first and second semiconductor layers 102 and 104 may represent silicon-based layers having a different crystalline orientation, wherein, for instance, the layer 102 may have a (110) or (100) orientation while the layer 104 may have a (100) or (110) orientation. A corresponding arrangement may be highly advantageous in applications in which different types of transistors are to be formed and the charge carrier mobility may be different for the respective crystalline orientations. Illustrative embodiments with different transistor types will be described with reference to FIGS. 2a-2f in more detail later on.

The transistor device 100 further comprises a gate electrode 105 formed above the second semiconductor layer 104 and separated therefrom by a gate insulation layer 106. The gate electrode 105 may be comprised, in this stage of manufacture, of doped polysilicon or any other appropriate material. The gate insulation layer 106 may be comprised of silicon dioxide, silicon nitride, silicon oxynitride and the like or any other appropriate material, wherein any high-k dielectric materials may also be used, possibly in combination with one or more of the materials specified before. In sophisticated applications, the gate electrode 105 may have a length, i.e., in FIG. 1a, the horizontal extension of the gate electrode 105, of 100 nm and significantly less or even 50 nm and even less for devices of the 90 nm technology, the 65 nm technology and the like. The gate electrode 105 may have formed thereon a capping layer 107, which may be comprised of silicon nitride, silicon oxynitride, silicon dioxide, a combination of any of the previous materials and the like. Moreover, a liner 109, for instance comprised of silicon dioxide, may be formed so as to enclose the gate electrode 105 including the capping layer 107 and the second semiconductor layer 104. Moreover, a spacer layer 108, for instance comprised of silicon nitride or any other appropriate material that may be used in a subsequent etch and epitaxial growth process as a corresponding hard mask, is formed substantially conformally on the device 100.

A typical process flow for forming the transistor device 100 as shown in FIG. 1a may comprise the following processes. After the formation of the substrate 101 including the first semiconductor layer 102, the buried insulating layer 103 and the second semiconductor layer 104, which may be accomplished by well-established wafer bond techniques and the like, a gate dielectric material may be formed by deposition and/or oxidation, followed by the deposition of a gate electrode material layer such as doped or undoped polysilicon. Subsequently, highly advanced photolithography and etch techniques may be used to pattern the deposited layer stack, wherein any anti-reflective coating (ARC) layers may also have been formed which may represent the capping material for the capping layer 107. In other embodiments, the patterning process for the gate electrode 105 and the gate insulation layer 106 may be based on a hard mask which may be maintained so as to act as the capping layer 107 in a subsequent manufacturing process. In other cases, a separate capping layer may be formed and may be patterned along with the gate electrode material and the gate insulation dielectric. Thereafter, the liner 109 may be deposited on the basis of well-established recipes followed by the deposition of the spacer layer 108, which may be accomplished by plasma enhanced chemical vapor deposition (PECVD). Thereafter, an anisotropic etch process may be performed to pattern the spacer layer 108 in accordance with well-established spacer formation techniques, thereby removing the material on horizontal portions, while substantially maintaining the material formed on the sidewalls of the gate electrode 105. Thereafter, exposed portions of the liner 109 may be removed, for instance by highly selective etch processes as are well established in the art.

Figure 1B:
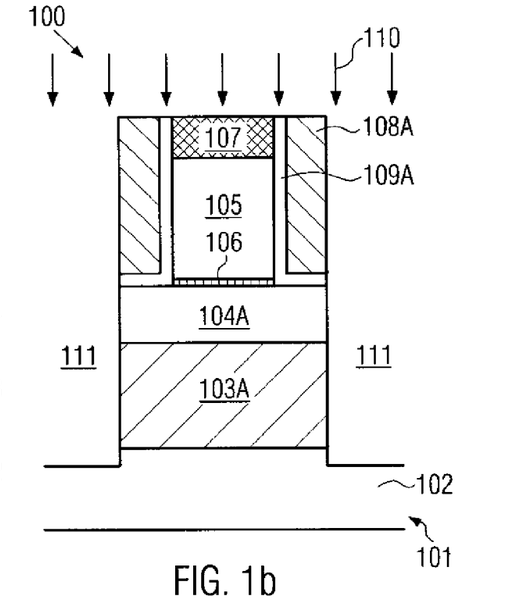

FIG. 1b schematically shows the transistor device 100 in a further advanced manufacturing stage, in which the device 100 is subjected to an etch process 110. During this etch process, the gate electrode 105 is encapsulated by spacers 108A, i.e., the residuals of the preceding anisotropic spacer etch process, and the capping layer 107 so that the etch process 110 results in a recess or cavity 111, whose lateral offset to the gate electrode 105 is substantially determined by the spacer 108A and the residual of the liner, now referred to as 109A.

Contrary to conventional techniques, the etch process 110 is designed to etch through the active layer 104, the buried insulating layer 103 and into the first semiconductor layer 102. For example, the etch process 110 may be performed with different etch chemistries to provide the desired etch behavior. For example, highly selective and anisotropic etch recipes are well established for a plurality of materials such as silicon with respect to silicon dioxide, silicon nitride and the like. Hence, when the layer 104 is substantially comprised of silicon, well-established recipes may be used to etch through the layer 104, wherein, depending on the etch recipe used, this phase of the etch process 110 may stop at the buried insulating layer 103. Thereafter, the etch chemistry may be appropriately selected for etching through the buried insulating layer 103, which may, for instance, be provided in the form of a silicon dioxide layer, wherein well-established recipes may be used. In some illustrative embodiments, a highly selective etch process for removing material of the buried insulating layer 103 in relation to the material of the semiconductor layer 102 may be used so that the corresponding etch process may be reliably stopped at the layer 102, thereby ensuring a high degree of etch uniformity across the entire substrate 101. Thereafter, a final etch step of the process 110 may be performed to etch into the semiconductor layer 102 on the basis of well-established recipes. Since the previous etch process for etching through the buried insulating layer 103 may have been performed with high selectivity to the layer 102, the final etch step may be performed in a highly uniform manner, especially as only a small penetration into the layer 102 is required. Consequently, a high degree of uniformity of the depth of the recess 111 across the substrate 101 may be obtained. After completion of the etch process 110, the residuals 104A, 103A of the layers 104 and 103 are maintained under the masked gate electrode 105. In one illustrative embodiment, the device 100 may now be prepared for a subsequent epitaxial growth process for forming a strained semiconductor material in the recess 111. Consequently, well-established cleaning processes may be performed to remove contaminants from the exposed surfaces of the device 100.

Figure 1C:
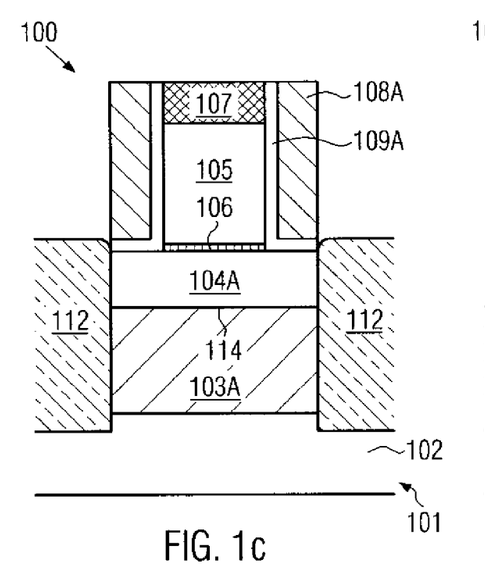

FIG. 1c schematically shows the device 100 after the completion of the selective epitaxial growth process, thereby forming a strained semiconductor material 112 in the recess 111. Selective epitaxial growth processes, i.e., a selective growth of the semiconductor material 112 on a crystalline "template" having a similar lattice spacing without a substantial adhesion of semiconductor material 112 on dielectric materials, such as the spacers 108A and the capping layer 107, may be established on the basis of well-known recipes or may be obtained on the basis of test runs. In one illustrative example, the crystalline semiconductor layer 102 may be comprised of silicon having a specified surface orientation with respect to surface orientation of the substrate 101, i.e., in FIG. 1c, the horizontal orientation, and a material having a similar lattice spacing such as silicon/germanium, silicon/carbon and the like may be grown on the exposed semiconductor layer 102, thereby forming substantially the same lattice structure. Accordingly, the semiconductor material 112 may be considered as a strained semiconductor material, since the "natural" lattice spacing of silicon/germanium or silicon/carbon is different from the lattice spacing of substantially pure silicon. For example, for a silicon/germanium material with a specified ratio of silicon and germanium, wherein the germanium contents may range up to 25 atomic percent, the natural lattice spacing is greater compared to silicon and, therefore, if the material 112 is grown with the same lattice spacing as the underling template of the layer 102, a strained material is formed which tends to provide compressive stress to adjacent materials, such as the active layer 104A, which may include the channel region or regions of the transistor 100.

In one illustrative embodiment, the transistor 100 may represent a P-channel transistor, the active area of which, i.e., the layer 104A, is to receive a compressive strain so as to enhance the mobility of holes, which represent the majority charge carriers. Thus, by providing the compressively strained semiconductor material 112, which may extend in the depth direction across the entire layer 104A, compressive strain may be efficiently generated in the layer 104A at an interface 114 between the gate insulation layer 106 and the layer 104A and also at an interface 121 between the buried insulating layer 103A and the layer 104A. Similarly, if the transistor 100 may represent an N-channel transistor, the material 112 may be formed as a material having a tensile strain, thereby also creating a tensile strain in the region 104A. For example, in this case, the material 112 may be provided in the form of silicon/carbon and the like. It should be appreciated that, in some embodiments, the strained material layer 112 may not necessarily extend down into the layer 102, as long as the material 112 is formed at least along substantially the entire thickness of the layer 104A. For example, during the epitaxial growth process, the same material as provided in the layer 102 may be deposited and thereafter the deposition atmosphere may be adjusted to deposit the strained material 112. For instance, when the layer 102 is comprised of silicon, in a first stage, silicon may be deposited up to a height that is anywhere below the interface 114 between the layers 104A and 103A, and, thereafter, a silicon/germanium or silicon/carbon, depending on the device requirements, may be deposited to form the strained semiconductor material 112.

Figure 1D:
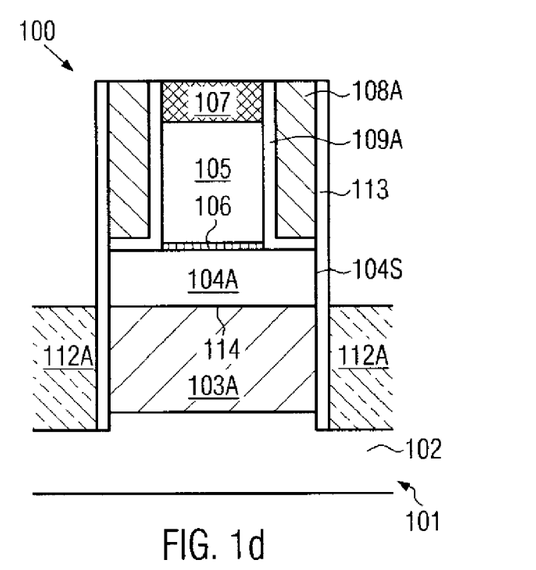

FIG. 1*d* schematically shows a transistor device 100 according to other illustrative embodiments, wherein, starting from the device as shown in FIG. 1*b*, a spacer 113 may be formed on the sidewalls of the recess 111 to minimize the influence of the exposed sidewall portions 104S of the layer 104A with respect to the epitaxial growth process. Thus, starting from the device of FIG. 1*b*, an appropriate spacer layer, for instance comprised of silicon dioxide, may be deposited in a conformal fashion on the basis of well-established recipes and thereafter an anisotropic etch process may be performed to remove the material of the spacer layer from horizontal device portions. Consequently, the spacer elements 113 may be formed on the spacers 108A and on sidewalls 104S of the layers 104A, 103A, thereby encapsulating the layer 104A during the subsequent epitaxial growth process. Moreover, a first portion 112A may be formed in the recess 111 on the basis of an appropriate epitaxial growth process, wherein only the material of the semiconductor layer 102 acts as a growth template, since any other crystalline regions, such as the sidewalls 104S of the layer 104A are covered by the spacer 113. A corresponding arrangement may be advantageous in embodiments in which the layers 104A and 102 may differ in crystalline orientation, material composition and the like, since now the epitaxial growth process forming the material 112A is determined by the crystalline characteristic of the layer 102 only.

Figure 1E:
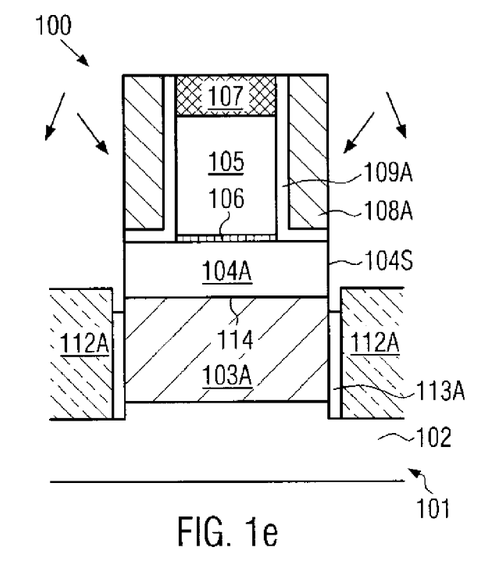

FIG. 1*e* schematically shows the transistor device 100 in a further advanced manufacturing stage according to further illustrative embodiments, wherein a portion of the spacer elements 113 is removed to expose the sidewall 104S of the layer 104A. A corresponding partial removal of the spacer elements 113 to leave a residual 113A may be accomplished by a highly selective isotropic etch process, wherein corresponding recipes are well established for a plurality of materials. For instance, silicon dioxide may be efficiently removed in a highly selective manner by diluted hydrofluoric acid and the like. Thereafter, the epitaxial growth process may be continued, wherein the crystalline growth is substantially determined by the material portion 112A and, therefore, the exposed crystalline surface 104S may not substantially affect the overall crystalline structure of the strained semiconductor material. For example, if the crystalline structure of the portion 112A differs from that of the layer 104A, only a slight mismatch will occur during the further epitaxial growth process in the vicinity of the exposed surface 104S, while the essential part of the grown material may exhibit the desire crystalline characteristics.

Figure 1F:
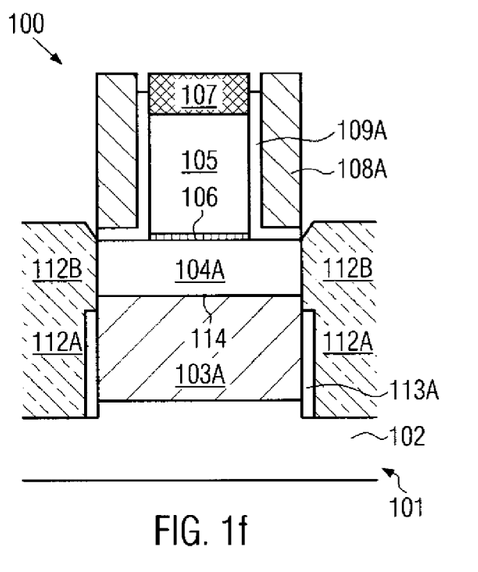

FIG. 1*f* schematically shows the transistor 100 after the completion of the epitaxial growth process, thereby forming a second portion 112B of strained semiconductor material above the portion 112A. It should be appreciated that also, in this case, the portions 112A, 112B may not necessarily be provided completely in the form of a strained semiconductor material, but may also include portions of substantially unstrained semiconductor material. For example, in FIG. 1*e*, the first portion 112A may be grown up to a height well below the exposed surface 104S on the basis of a non-strained material and, thereafter, the second portion 112B may be grown partially as non-strained material and partially as strained material or as a completely strained material. Similarly, if a certain degree of "overgrowth" is desired to provide raised drain and source regions for the device 100, a part of the portion 112B may be provided in the form of a non-strained material or a strained material, depending on the process and device requirements. In other embodiments, the epitaxial growth process may be discontinued without providing any raised portions, when raised drain and source regions are considered inappropriate. Thereafter, the further manufacturing process may be continued, in some illustrative embodiments, on the basis of well-established techniques, including the removal of the spacers 108A, the liner 109A and the capping layer 107, the formation of an appropriate sidewall spacer structure and intermittent corresponding implantation processes for providing the required dopant profile to define drain and source regions. In other embodiments, the above described process sequence may be altered in that appropriate dopant profiles may be provided so as to enable the operation of the device 100 as a transistor device, fully depleted or partially depleted, having two channel regions to enhance performance of the device 100. As previously explained, for extremely scaled SOI-like transistors, that is, a thickness of the layer 104A may be approximately 100 nm and even significantly less, the interface 114 between the layer 104A and the buried insulating layer 103A may also be used as a channel region and, thus, the corresponding implantation processes may be adapted to provide an appropriate connection, i.e., PN junction, to this further channel region. For this purpose, the corresponding sidewall spacer structure, i.e., the width of the individual sidewall spacers within the sidewall spacer structure and the corresponding implantation parameters may be re-adjusted to obtain the desired dopant profile.

Figure 1G:
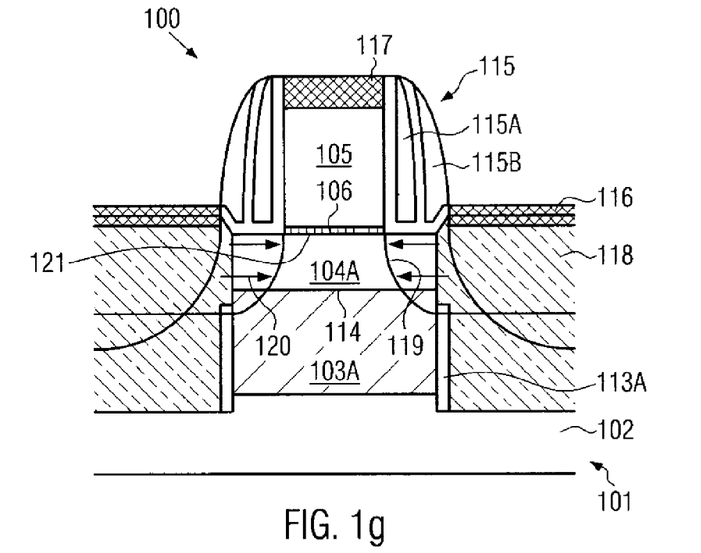

FIG. 1*g* schematically shows the transistor 100 after the completion of the above described process sequence. Thus, the transistor 100 comprises a sidewall spacer structure 115 adjacent to the gate electrode 105, wherein the spacer structure 115 may include a plurality of individual spacers 115A, 115B, the number and dimension of which depends on the required horizontal dopant profile of a respective drain and source region 118. In the present example, two individual spacer elements, i.e., the spacers 115A, 115B, are provided to obtain a specified dopant profile in the drain and source region 118, wherein a corresponding PN junction 119 is appropriately located in the layer 104A to appropriately connect to corresponding channel regions, which may be located in the vicinity of the interfaces 121 and 114. Moreover, metal silicide regions 116 and 117 may be formed in and on the drain and source region 118 and the gate electrode 105. Since the region 104A is laterally enclosed by the strained semiconductor material 112, a corresponding strain 120 is efficiently formed in the layer 104A in the vicinity of the interface 121 as well as in the vicinity of the interface 114. In the example shown, the strain 120 is illustrated as a compressive strain to enhance the hole mobility within the layer 104A and particularly within any channels that may form at the interfaces 121, 114 during the operation of the transistor 100.

As previously described, the transistor 100 may be formed on the basis of well-established process techniques, wherein, in some illustrative embodiments, at least the design of the spacer structure 115 and the corresponding implantation cycles is correspondingly adapted to locate the PN junction 119 in an appropriate manner in order to connect to both channel regions at the interfaces 121 and 114. Thereafter, the metal silicide regions 116, 117 may be formed on the basis of well-established techniques, such as the deposition of a refractory metal and a subsequent heat treatment for initiating the conversion into metal silicide, when the gate electrode 105 and the drain and the source regions 118 comprise a significant amount of silicon.

It should be appreciated that the configuration of the device 100 as shown in FIG. 1g is highly advantageous for a P-channel transistor, since, in this case, a compressive strain in the region 104A may significantly increase the hole mobility, thereby also enhancing the drive current capability of the device 100. In other embodiments, a tensile strain may be generated by providing a correspondingly strained semiconductor material in the drain and source region 118 as is previously explained. Moreover, as is previously explained, the crystalline structure in the drain and source region 118 is substantially defined by the epitaxial growth of the strained semiconductor material, which in turn is based on the crystalline template provided by the semiconductor layer 102 and, therefore, a crystalline structure in the drain and source region 118 may be adjusted substantially independently from the crystalline configuration of the layer 104A, which may be highly advantageous when different types of transistors are to be formed on the basis of the second semiconductor layer 104A, as will be described in more detail with reference to FIGS. 2a-2f.

Figure 2A:
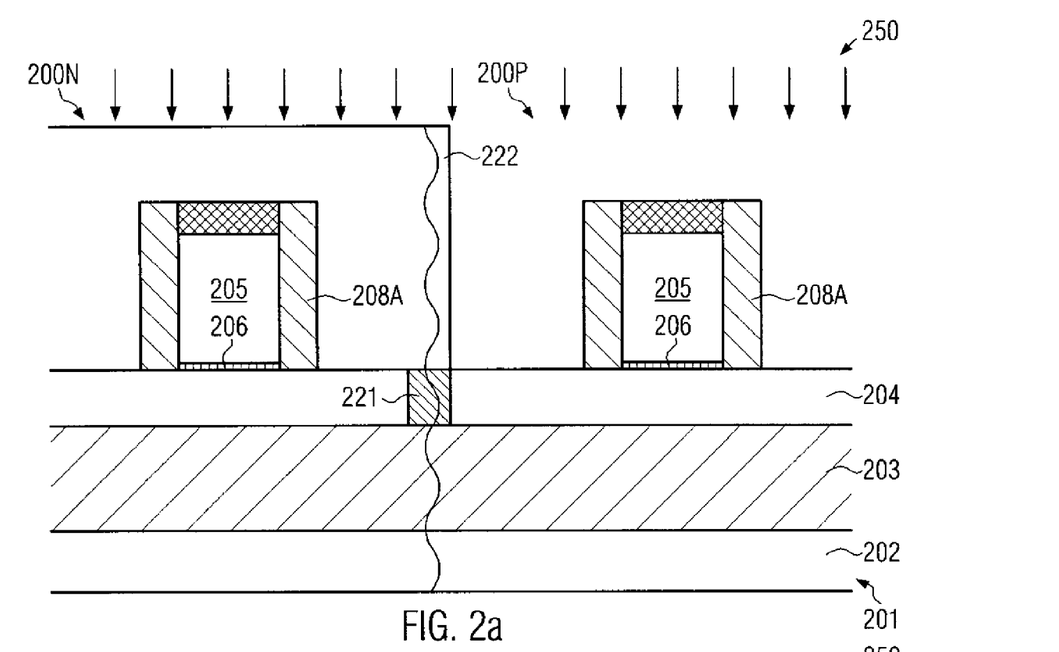
FIGS. 2a-2f schematically show cross-sectional views of a semiconductor device including SOI transistors of different conductivity types, one of which receives a strained semiconductor material for providing strain at an interface between a buried insulating layer and the overlying semiconductor material in accordance with still further illustrative embodiments of the present invention.

FIG. 2a schematically shows a cross-sectional view of a semiconductor device 250 comprising a first transistor 200N and a second transistor 200P. The transistors 200N, 200P may represent transistors provided on different substrate areas or die areas and/or may represent transistors of different configuration and/or may represent transistors of different conductivity types. For example, the transistor 200N may represent an N-channel transistor, while the transistor 200P may represent a P-channel transistor. The device 250 further comprises a substrate 201 having formed thereon a first crystalline semiconductor layer 202, followed by a buried insulating layer 203 on which is formed a second crystalline semiconductor layer 204. Regarding the characteristics of the substrate 201 and the layers 202, 203 and 204, the same criteria apply as previously described with respect to the substrate 101 and the layers 102, 103 and 104. At this manufacturing stage, the first and second transistors 200N, 200P may comprise a gate electrode 205 formed on a gate insulation layer 206, wherein the gate electrodes 205 are encapsulated by a corresponding capping layer 207 and sidewall spacers 208A. Moreover, depending on device requirements, an isolation structure 221 may be provided to separate the first and second transistors 200N, 200P. Furthermore, the first transistor 200N may be covered by a hard mask 222, which may be comprised of silicon nitride, silicon dioxide or any other appropriate material.

As previously explained, the difference in one or more characteristics of the transistors 200N, 200P may require that the performance of these transistors be individually enhanced, for instance by individually generating strain in the channel region(s) of one of the transistors 200N, 200P or by any other appropriate strategies. In one illustrative embodiment, the transistor 200N may represent an N-channel transistor, in which the electron mobility may be maintained at a moderately high level by providing the layer 204 as a silicon-based layer having a surface orientation (100). The second transistor 200P may represent a P-channel transistor, whose reduced hole mobility, owing to the reduced mobility of holes in a (100) silicon, may be enhanced by locally applying strain in the respective channel region by an embedded strained semiconductor material in the respective drain and source region, as is described with reference to FIGS. 1a-1g for the transistor 100. Additionally, the junction resistance of the drain and source region to be formed in the second transistor 200P may be enhanced by providing a (110) orientation to enhance the hole mobility, at least in this transistor area. Consequently, a crystalline orientation of the first semiconductor layer 202 may be selected as a (110) orientation, thereby providing a crystal template for the subsequent processing which is highly advantageous for enhancing the series resistance of the transistor 200P.

The device 250 as shown in FIG. 2a may be manufactured on the basis of well-established process techniques as are also described with reference to FIG. 1a. Additionally, the hard mask 222 may be formed on the basis of well-established photolithography and etch techniques, for example, after encapsulating the gate electrodes 205 on the basis of a technique as is also described in FIG. 1a. For example, a thin liner layer (not shown) may be deposited followed by the hard mask material, which is then etched on the basis of a corresponding photolithography mask, wherein the liner may act as an etch stop layer. Thereafter, the liner may be removed from the exposed transistor 200P to obtain the configuration as shown in FIG. 2a. Thereafter, a cavity or recess etch process may be performed in order to selectively etch the exposed portions of the transistor 200P, thereby forming a recess through the layer 204, the layer 203 and into the semiconductor layer 202. As previously explained, during a subsequent epitaxial growth process, an interference of the layer 204 may be reduced especially when the layer 204 differs in crystal orientation, material composition and the like with respect to the layer 202. Thus, in one illustrative embodiment, a spacer layer may be formed prior to the epitaxial growth process.

Figure 2B:
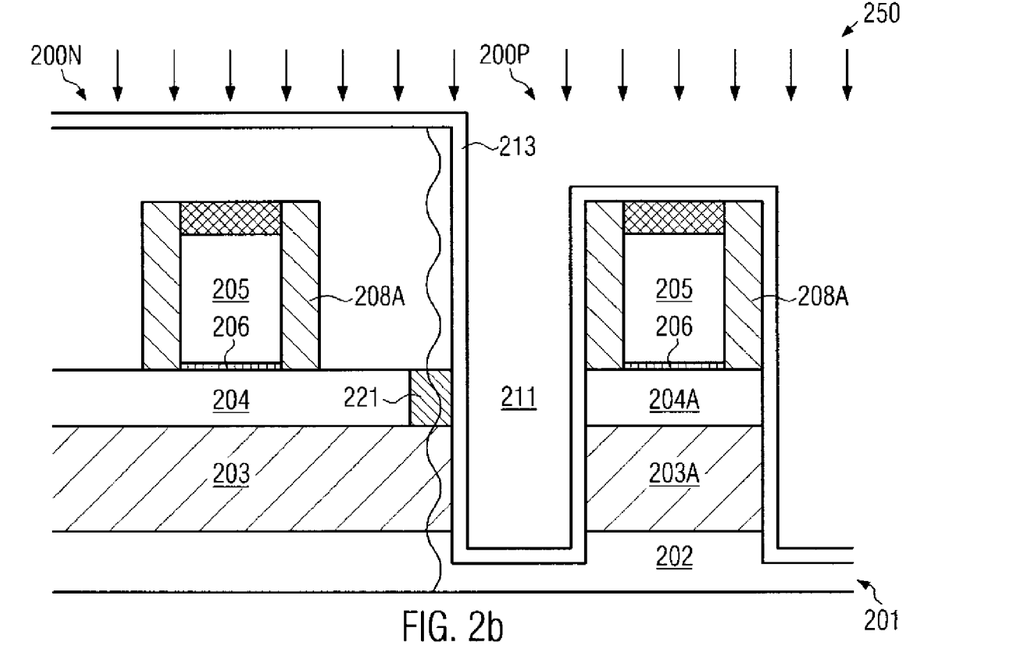

FIG. 2b schematically shows the device 250 after the anisotropic etch process for forming a recess 211 adjacent to the encapsulated gate electrode 205 of the second transistor 200P, wherein, additionally, a spacer layer 213 is conformally formed on the device 250. For example, the spacer layer 213 may be comprised of silicon dioxide, silicon oxynitride or any other appropriate dielectric material that substantially inhibits the deposition of semiconductor material during the subsequent epitaxial growth process. In other embodiments, an extremely thin material layer may be formed by any appropriate deposition technique, such as chemical vapor deposition (CVD), atomic layer deposition (ALD) for depositing a conductive material, such as a highly doped semiconductor of quite different crystalline characteristics compared to the layer 202, or any refractory metal or material compounds exhibiting a moderate conductivity, while reducing the deposition rate in a subsequent epitaxial growth process. In some illustrative embodiments, a thickness of the layer 213 may be less than approximately 1 nm so as to reduce an effect of the layer 213 on the device behavior, when this layer is not removed prior to completing the subsequent epitaxial growth process.

Thereafter, the device 250 may be subjected to an anisotropic etch process in accordance with well-established process recipes for removing the material of the layer 213 from horizontal device portions.

Figure 2C:
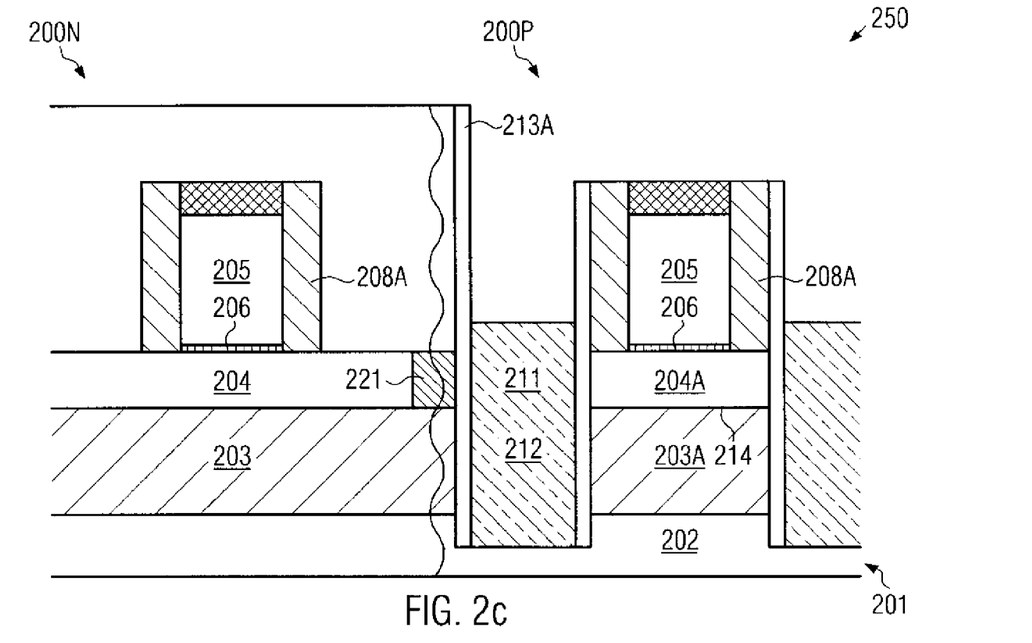

FIG. 2c schematically shows the device 250 after the completion of the above-described spacer formation process. Hence, the device 250 comprises a spacer 213A formed on sidewall portions of the recess 211. In some embodiments, the spacer 213A may be formed of a material that may avoid or at least reduce the deposition of semiconductor material during the subsequent epitaxial growth process, while on the other hand may exhibit a moderately high conductivity so that the spacer 213A may not have to be removed during the subsequent epitaxial growth process. For example, a highly doped semiconductor material of different characteristics and with a significantly different lattice spacing may be used. Moreover, the recess 211 may be filled by a strained semiconductor material 212, the characteristics of which are substantially determined by the layer 202, wherein any influence from the layer 204A may be significantly suppressed due to the spacer 213A. In one illustrative embodiment, the material 212 may comprise strained silicon/germanium having a (110) orientation. In other embodiments, further processing may be continued, as is also described with reference to FIG. 1c, by performing a multiple step epitaxial growth process.

Figure 2D:
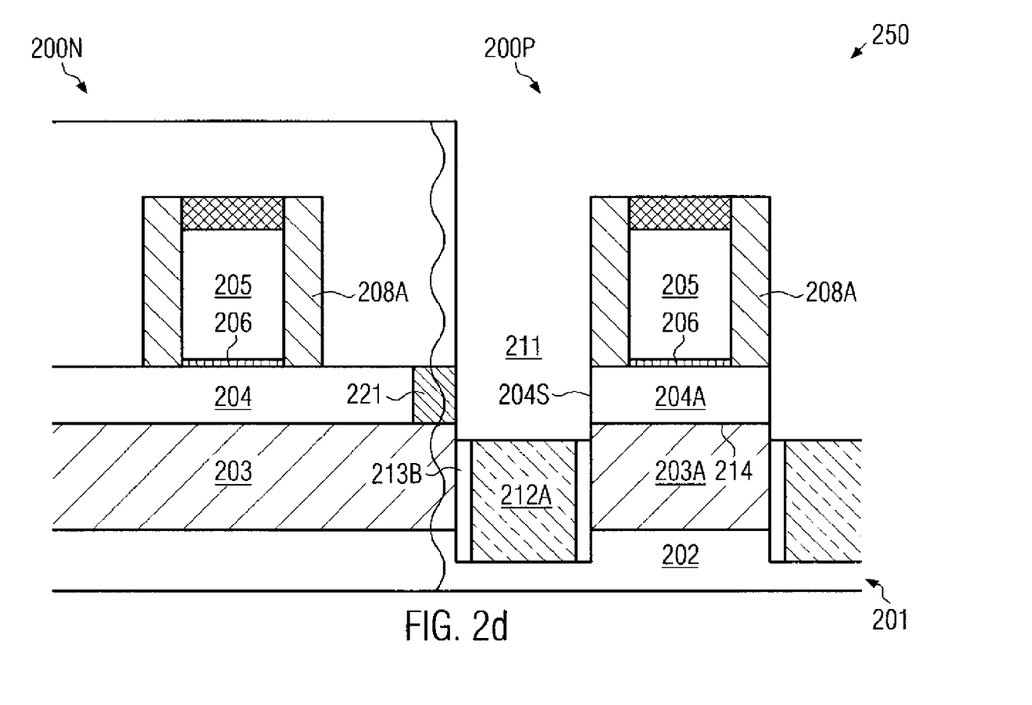

FIG. 2d schematically shows the device 250 after a first step of epitaxial growth, wherein a first portion 212A of semiconductor material, which may be a strained material or a non-strained material, is formed in the recess 211. Moreover, the spacer 213A may be partially removed to form a spacer 213B that exposes the sidewalls 204S of the region 204A. The partial removal of the spacer 213A may be accomplished by an isotropic etch process, as is previously described with reference to the spacer 113A.

Figure 2E:
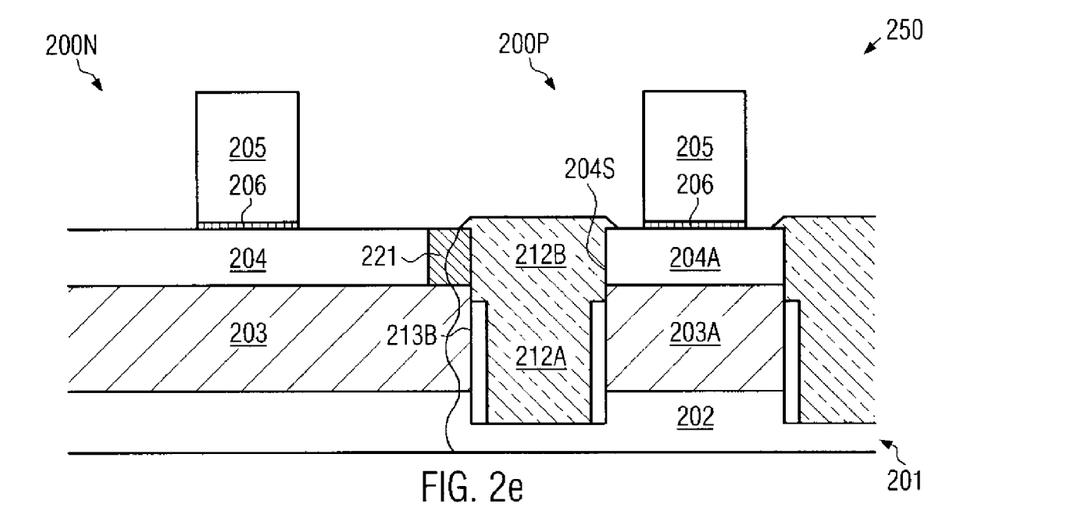

FIG. 2e schematically shows the semiconductor device 250 after the completion of the epitaxial growth process and the removal of the encapsulations for the gate electrodes 205 and the removal of the hard mask 222. Thus, the device 250 comprises an upper portion 212B of strained semiconductor material, which begins at an interface 214 or at any lower-lying location, which now exerts a desired stress to the region 204A via the sidewall 204S to create a desired type of strain therein. For example, a compressive strain may be created by the portion 212B when the transistor 200P represents a P-channel transistor. As previously explained, a desired degree of overgrowth may be provided in accordance with design requirements, when a transistor architecture with raised drain and source regions is to be formed. It should be appreciated that the portions 212B and 212A may have crystallographic characteristics that are substantially determined by the semiconductor layer 202 as is also previously explained. Due to the "late" exposure of the sidewall 204S during a final phase of the epitaxial growth process, the influence, i.e., lattice mismatch, of the layer 204A on the portion 212B is significantly less and, thus, the electrical characteristics of the portion 212B are substantially determined by the layer 202. That is, if, for instance, a (110) orientation is provided in the layer 202, the portion 212B may also have substantially a (110) orientation with an acceptable amount of lattice irregularities in the vicinity of the surface 204S. Thus, the overall resistance of the portion 212B, that is the hole mobility, may be significantly enhanced, thereby additionally increasing current drive capability of the transistor 200P.

Figure 2F:
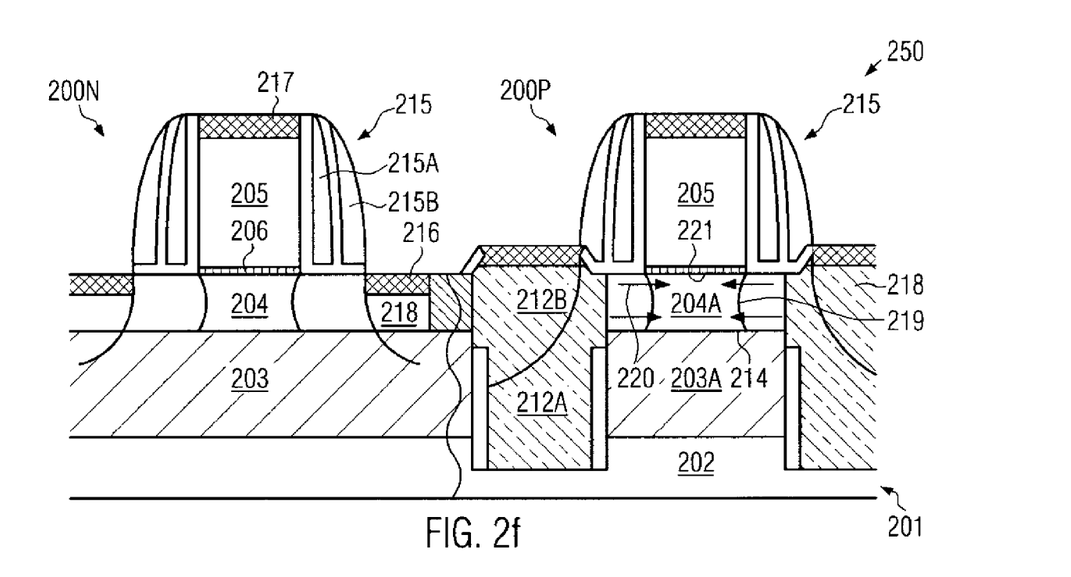

FIG. 2f schematically shows the device 250 in a further advanced manufacturing stage. Here, the first and second transistors 200N, 200P each comprise a respective spacer structure 215 with one or more individual spacer elements 215A, 215B, wherein the spacer structure 215 is dimensioned so as to obtain a required dopant profile in drain and source regions 218 of the transistors 200N, 200P, as is also described with reference to FIG. 1g. Consequently, the dopant profile and the location of corresponding PN junctions 219, which may be of different conductivity type, when N- and P-channel transistors are considered, may be defined such that a double channel configuration may be established for partially or fully deplete SOI-like transistors in which the active layer 204A has a thickness in the above-specified range. Moreover, corresponding metal silicide regions 217 and 216 may be formed in the gate electrodes 205 and the drain and source regions 218.

Regarding any manufacturing processes and techniques for forming the device 250, the same criteria apply as previously explained with reference to the transistor 100, wherein the corresponding implantation cycles, however, are performed individually for each of the transistors 200N and 200P. Thus, the transistor 200P comprises a drain and source region 218, which provides a desired type of strain 220, which prevails at an interface 221 between the gate insulation layer 206 and the layer 204A and also at the interface 214 between the buried insulating layer 203A and the layer 204A. In addition, the series resistance of the drain and source region 218 may be reduced by appropriately selecting the crystalline properties of the epitaxial grown material, which may have a different crystalline orientation compared to the layer 204A. Thus, the transistor 200N may have an enhanced electron mobility due to appropriately selected crystalline orientation of the layer 204A, while the second transistor 200P may be enhanced in performance by providing the strain 220 and providing an optimal crystal orientation within the drain and source region 218. It should be appreciated that other configurations may be selected in which, for instance, additional strain-inducing mechanisms are provided, for instance in the form of the sidewall spacer structure 215 and/or by means of a contact etch stop layer (not shown) to be formed over the first and second transistor 200N, 200P. Moreover, by appropriately masking one of the transistors 200N, 200P while processing the other transistor, an embedded strained semiconductor layer may also be provided in the first transistor 200N to further enhance the performance of the first transistor 200N.

As a result, the present invention provides a technique that enables an improved strain-creating mechanism in SOI devices and SOI-like devices, in that an embedded strained semiconductor layer is formed on the basis of a recess that extends through the buried insulating layer, thereby using the underlying crystalline material as a growth template. Consequently, the strained semiconductor layer may be formed adjacent to the entire active semiconductor region formed on the buried insulating layer, thereby improving the stress transfer mechanism. Additionally, the crystalline characteristics of the strained semiconductor layer may be substantially decoupled from the crystalline characteristics of the active semiconductor layer, thereby providing additional design flexibility in obtaining enhanced performance, especially when transistors of different conductivity types have to be formed as is the case in advanced CMOS techniques. In sophisticated applications, in which very thin SOI transistors, such as fully or partially depleted transistors, are to be formed, both interfaces, i.e., the interface between the gate insulation layer and the interface between the active region and the buried insulating layer, may be used as channel regions, wherein both channels may be efficiently strained on the basis of the embedded semiconductor material.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
    forming a recess adjacent to a first gate electrode of a first transistor, said first gate electrode formed above a substrate comprising a first crystalline semiconductor layer, a buried insulating layer formed on said first crystalline semiconductor layer and a second crystalline semiconductor layer formed on said buried insulating layer, said recess extending into said first crystalline semiconductor layer;
    epitaxially growing a strained semiconductor material in said recess;
    forming a drain and source region in said strained semiconductor material by implanting a dopant species into said strained semiconductor material; and
    adjusting a dopant profile of said implanted species to define a first channel region and a second channel region, said first channel located at an interface of a gate insulation layer and said second semiconductor layer, said second channel region located at an interface of said buried insulating layer and said second semiconductor layer.

2. The method of claim 1, further comprising forming a sidewall spacer on sidewalls of said recess.

3. The method of claim 2, wherein epitaxially growing said strained semiconductor material comprises growing a first portion of said strained semiconductor material, removing an exposed portion of said sidewall spacer in said recess and continuing said epitaxial growth process.

4. The method of claim 1, further comprising covering a second transistor area while forming said recess and epitaxially growing said strained semiconductor material.

5. The method of claim 4, further comprising forming a second transistor in said second transistor area, said second transistor including a drain and source region defined in second crystalline semiconductor layer without extending through said buried insulating layer.

6. The method of claim 5, wherein a conductivity type of said first transistor differs from a conductivity type of said second transistor.

7. The method of claim 5, wherein said first crystalline semiconductor layer differs from said second crystalline semiconductor layer in at least one of crystalline orientation and material composition.

8. The method of claim 7, wherein said first transistor is an N-channel transistor and said second semiconductor layer has a <100> orientation.

9. The method of claim 7, wherein said first transistor is a P-channel transistor and said second semiconductor layer has a <110> orientation.

10. The method of claim 7, wherein said first transistor is an N-channel transistor and said second semiconductor layer has a <100> orientation and wherein said second transistor is a P-channel transistor and said first semiconductor layer has a <110> orientation.

11. The method of claim 7, wherein said first transistor is a P-channel transistor and said second semiconductor layer has a <110> orientation and wherein said second transistor is an N-channel transistor and said first semiconductor layer has a <100> orientation.

12. The method of claim 1, wherein said first crystalline semiconductor layer differs from said second crystalline semiconductor layer in at least one of crystalline orientation and material composition.

13. The method of claim 1, wherein said strained semiconductor material is selected to generate compressive strain in said second crystalline semiconductor layer.

14. The method of claim 13, wherein said strained semiconductor material comprises silicon/germanium.

15. The method of claim 14, wherein said first crystalline semiconductor layer comprises silicon with a <110> orientation.

16. The method of claim 1, wherein said strained semiconductor material is selected to generate tensile strain in said second crystalline semiconductor layer.

17. The method of claim 16, wherein said first crystalline semiconductor layer comprises silicon with a <100> orientation.

18. The method of claim 1, wherein said drain and source regions are raised drain and source regions.

* * * * *